United States Patent [19]

Miyasaka

[11] Patent Number: 4,503,448

[45] Date of Patent: Mar. 5, 1985

[54] SEMICONDUCTOR INTEGRATED CIRCUIT DEVICE WITH A HIGH TOLERANCE AGAINST ABNORMALLY HIGH INPUT VOLTAGE

[75] Inventor: Kiyoshi Miyasaka, Yokohama, Japan

[73] Assignee: Fujitsu Limited, Kawasaki, Japan

[21] Appl. No.: 625,195

[22] Filed: Jun. 28, 1984

Related U.S. Application Data

[63] Continuation of Ser. No. 278,713, Jun. 29, 1981.

[30] Foreign Application Priority Data

Jul. 1, 1980 [JP]  Japan ................................. 55-89482

[51] Int. Cl.³ .................... H01L 29/78; H01L 29/90; H01L 27/02; H01L 49/00
[52] U.S. Cl. ................................. 357/23.13; 357/13; 357/41; 357/91
[58] Field of Search ................. 357/23 GP, 41, 13, 91

[56] References Cited

U.S. PATENT DOCUMENTS

| | | | |
|---|---|---|---|
| 3,395,290 | 7/1968 | Farina et al. | 357/41 |
| 3,673,428 | 1/1972 | Athanas | 307/202 |
| 3,746,946 | 7/1973 | Clark | 357/41 |
| 3,909,306 | 9/1975 | Sakamoto | 357/91 |
| 4,032,372 | 1/1977 | Vora | 357/44 |
| 4,057,844 | 11/1977 | Smedley | 357/41 |
| 4,139,935 | 2/1979 | Bertin et al. | 357/23 GP |

FOREIGN PATENT DOCUMENTS 55-108771  8/1980  Japan .................................. 357/41

Primary Examiner—Andrew J. James
Assistant Examiner—Jerome Jackson
Attorney, Agent, or Firm—Staas & Halsey

[57]  ABSTRACT

A semiconductor integrated device with a high tolerance against abnormally high input voltages comprises a first MIS transistor at the input stage and a second MIS transistor of the internal elements of the device. The source of the first MIS transistor is connected to an input electrode. The drain of the first MIS transistor is connected to the gate of the second MIS transistor. The source region of the first MIS transistor comprises phosphoric atoms. The other diffusion regions comprise arsenic atoms. Therefore, the depth of the source region of the first MIS transistor is greater than the other diffusion region. In addition, the source region of the first MIS transistor has a considerable gradient with regard to the concentration of the phosphoric atoms. As a result, the depletion layer between the source region of the first MIS transistor and the semiconductor substrate is broader than in the other region. Consequently, a high tolerance against abnormal high input voltages is obtained.

7 Claims, 9 Drawing Figures

SEMICONDUCTOR INTEGRATED CIRCUIT DEVICE WITH A HIGH TOLERANCE AGAINST ABNORMALLY HIGH INPUT VOLTAGE

This application is a continuation of application Ser. No. 278,713, filed 06/29/81.

BACKGROUND OF THE INVENTION

The present invention relates to a semiconductor integrated device with a high tolerance against abnormally high input voltages, and more particularly to a metal-insulator semiconductor integrated device having such a tolerance.

Metal-insulator semiconductor devices have advantages over bipolar semiconductor devices in a lower number of manufacturing steps, in a smaller area required for each element, in a narrower isolation region between adjacent elements, etc. Because of these advantages, metal-insulator semiconductor devices are useful for integrated circuits of, for example, memory circuits or logic circuits. In order to achieve a high speed operation of these integrated circuits, technical attempts have been made to minimize the metal-insulator semiconductor device by more and more decreasing the size of each element in the device, or by forming a shallow surface layer. Such attempts have reached a high integration degree. However, the miniaturization of the integrated device has been causing a problem, namely the lowering of the tolerance voltage against abnormally high input voltages. Such an abnormal voltage occurs due to, for example, static electricity produced by friction of the input pins of the device with other materials. While the tolerance voltage is up to several tens of volts, the abnormal voltage due to static electricity reaches more than several thousand volts. Therefore, the minimized integrated device is easily destroyed by such an abnormal voltage.

SUMMARY OF THE INVENTION

An object of the present invention is to provide a semiconductor integrated device with a high tolerance voltage against an abnormally high input voltage.

Another object of the present invention is to provide a metal-insulator semiconductor integrated device with a high tolerance voltage against an abnormally high input voltage.

Still another object of the present invention is to provide such a device with a high input tolerance voltage against a high voltage due to static electricity.

A still further object of the present invention is to provide such a device in which the gate insulating layer of the input-stage element has a high tolerance voltage against an abnormally high input voltage.

In order to achieve the above objects, the present invention provides a semiconductor integrated device with a high tolerance against abnormal high input voltages, comprising: a semiconductor substrate having one conductivity; an input electrode formed on the semiconductor substrate; a first MIS transistor formed on the semiconductor substrate for constituting an input stage of the semiconductor integrated device, including a first source region and a first drain region each having the opposite conductivity to the one conductivity, the first source region or the first drain region being electrically connected to the input electrode; and a second MIS transistor formed on the semiconductor substrate for constituting an internal circuit of the semiconductor integrated device, including a gate electrode, a second source region, and a second drain region, each of the second source region and the second drain region having the opposite conductivity to the one conductivity, the gate electrode being electrically connected to the first source region or the first drain region opposite to the region connected to the input electrode; characterized in that; the first source region or the first drain region, connected to the input electrode, has a depth greater than the depth of the second source or drain region.

BRIEF DESCRIPTION OF THE DRAWING

The foregoing objects as well as the characteristic features of the invention will become more apparent and more readily understandable by the following description relating to the accompanying drawings, in which like reference numerals designate the same or similar parts throughout the figures thereof and wherein.

DESCRIPTION OF THE PREFERRED EMBODIMENT

Before describing the preferred embodiment of the present invention, conventional metal-insulator semiconductor devices will first be explained with reference to FIGS. 1A, 1B, 2A and 2B.

Figure 1A:
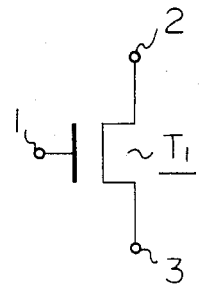
FIG. 1A is a circuit diagram of a conventional MIS (Metal-Insulator Semiconductor) transistor.
Figure 1B:
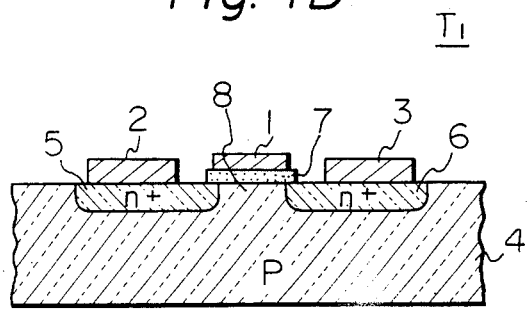
FIG. 1B is a schematic cross-sectional view illustrating the structure of the transistor of FIG. 1A.

FIG. 1A is a circuit diagram of a conventional MIS transistor $T_1$. In FIG. 1A, the transistor $T_1$ comprises a gate electrode 1, a source electrode 2, and a drain electrode 3. FIG. 1B is a schematic cross-sectional view illustrating the structure of the transistor $T_1$ of FIG. 1A. In FIG. 1B, n+-type source and drain regions 5 and 6 are formed near the surface of a p-type semiconductor substrate 4, by diffusing n+-type impurity ions, e.g., arsenic ions. The source electrode 2 and the drain electrode 3 are in electrical contact with the source region 5 and the drain region 6, respectively. The gate electrode 1 is formed on the semiconductor substrate through an insulating film 7. A channel region 8 is formed in operation of this device near the surface of the substrate 4 and between the source region 5 and the drain regions 6.

Recent technology trends have attempted to decrease the size of each region and each electrode along with the improvement of the integration degree of semiconductor devices. For example, the channel length of the channel region 8 has become about 2 μm; the junction depth of the source region 5 or the drain region 6 has become about 3000 angstrom; and the thickness of the insulating film 7 has become about 400 to 500 angstrom. Because the operating voltage is about 5 volts, there is no problem in the operation of the transistor of FIG. 1A or 1B in spite of such a fine and minimized structure, but rather, a high switching speed has resulted.

However, due to such a fine and minituarized structure, the tolerance voltage of the transistor has been decreased. For example, the tolerance voltage of the insulating film 7 is up to several tens of volts. Accordingly, if a high voltage of more than several hundred volts is applied to the transistor of FIG. 1A or 1B, the transistor will be easily destroyed. Such a high voltage may often be caused by static electricity as previously mentioned.

Figure 2A:
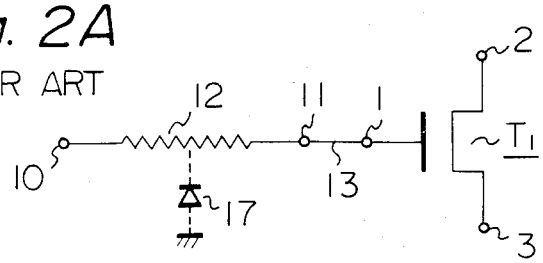
FIG. 2A is a conventional circuit diagram including the MIS transistor and a protecting circuit for the MIS transistor.
Figure 2B:
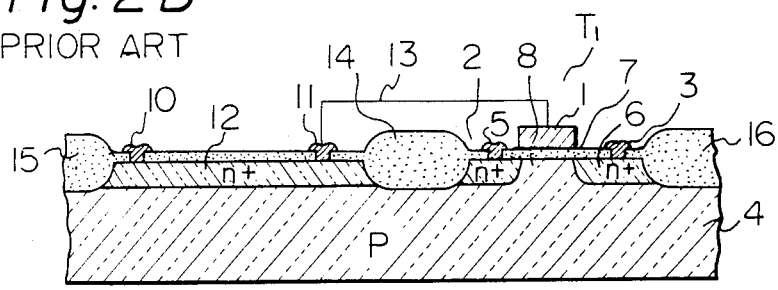
FIG. 2B is a schematic cross-sectional view illustrating the structure of the device of FIG. 2A.

In order to increase the tolerance voltage of the semiconductor element, a semiconductor device was proposed in which a protection circuit was connected between the input terminal and the gate electrode of the transistor (see U.S. Pat. No. 3,673,428, FIG. 1, in the name of RCA, filed on Sept. 18, 1970 or, Japanese Patent Publication No. 48-16031, FIG. 1a and FIG. 1b). FIG. 2A is such a conventional circuit diagram including the MIS transistor $T_1$ and a protecting circuit for the MIS transistor $T_1$. As illustrated in FIG. 2A, a protecting circuit comprises an input electrode 10, a resistor 12 and another electrode 11 electrically connected through a conduction lead 13 to the gate electrode 1 of the MIS transistor $T_1$. FIG. 2B is a schematic cross-sectional view illustrating the structure of the device of FIG. 2A. In FIG. 2B, the resistor 12 is formed as an $n^+$-type diffusion region 12 near the surface of the semiconductor substrate 4. On both sides of the $n^+$-type diffusion 12, the input electrode 10 and the other electrode 11 are in electrical contact with the $n^+$-type diffusion region 12. The structure of the transistor $T_1$ is the same as that in FIG. 1B. The electrode 11 is electrically connected through the lead 13 to the gate electrode 1. The $n^+$-type diffusion region 12 and the source region 5 of the transistor $T_1$ are electrically separated by an isolation region 14. The input portion of the $n^+$-type diffusion region 12 is electrically separated from others by an isolation region 15. Also, the drain region 6 of the transistor $T_1$ is electrically separated from others by an isolation region 16. Usually, the $n^+$-type diffusion region 12 is electrically insulated from the p-type semiconductor substrate 4 due to the PN junction diode 17 (as illustrated in FIG. 2A) between them. The insulating film 7 is sufficiently thick so that the tolerance voltage of the insulating film 7 is greater than the tolerance voltage of the PN junction diode between the $n^+$-type diffusion region 12 and the p-type semiconductor substrate.

In operation, when a voltage is applied to the input electrode 10, the voltage across the PN junction diode 17 is in the reverse direction. If an excessive voltage is applied to the input electrode 10, an avalanche breakdown or a Zener breakdown will occur in the PN junction diode 17, that is, a junction breakdown will occur so that the resistor 12 and the substrate 4 will be short-circuited. Therefore, not only by the voltage drop across the resistor 12, but also by the short-circuit across the PN junction diode 17, the excessive voltage is not applied to the gate electrode 1 of the transistor $T_1$. When the input voltage applied to the input electrode 10 is not too excessive, the PN junction diode 17 only causes the avalanche breakdown or the Zener breakdown, and is not destroyed.

Figure 3A:
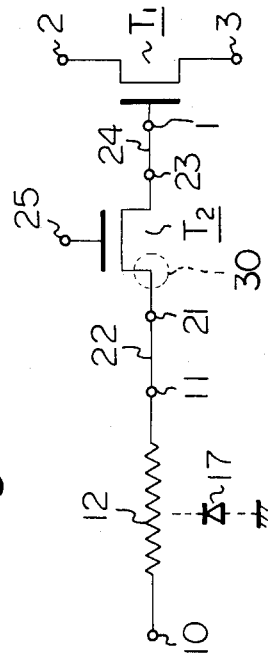
FIG. 3A is another circuit diagram including the MIS transistors and a protecting circuit.

FIG. 3A is another circuit diagram including the MIS transistors and a protecting circuit, for explaining both a conventional device and the device according to an embodiment of the present invention. The difference between the circuits of FIG. 2A and FIG. 3A is that another MIS transistor $T_2$ is inserted between the electrode 11 and the gate electrode 1 of the transistor $T_1$. That is, the source electrode 21 of the transistor $T_2$ is connected through a conduction lead 22 to the electrode 11 of the resistor 12. The drain electrode 23 of the transistor $T_2$ is connected through a conduction lead 24 to the gate electrode 1 of the transistor $T_1$. The gate electrode 25 of the transistor $T_2$ is connected to the other internal circuit (not shown). The transistor $T_2$ constitutes an input-stage transistor. The transistor $T_1$ constitutes an element of the internal circuit. By the circuit configuration of FIG. 3A, it has been considered that the insulating film 7 under the gate electrode 1 of the transistor $T_1$ could be sufficiently protected against an excessive high voltage applied to the input electrode 10, due to the existence of the resistor 12, the PN junction diode 17, and the channel region of the transistor $T_2$. However, in the conventional device, because the depth of the source region 30' of the transistor $T_2$ is substantially the same as other diffusion regions, a breakdown easily occurs between the source region 30 and the semiconductor substrate 4 near the surface of the substrate, when an excessive high voltage is applied to the input electrode 10, as will be explained in detail in conjunction with FIG. 3C. Therefore, according to the embodiment of the present invention, the source region 30 of the transistor $T_2$ is made to have a much greater depth than the other diffusion regions.

Figure 3B:
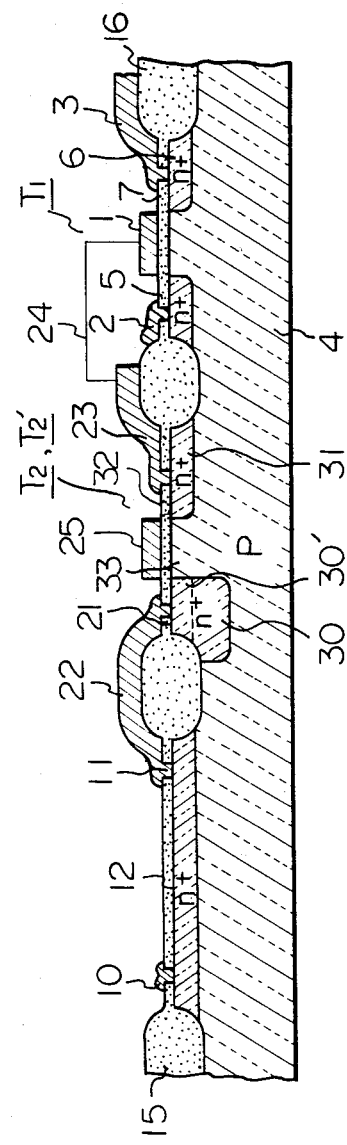
FIG. 3B is a schematic cross-sectional view illustrating the structure of the device of FIG. 3A, according to an embodiment of the present invention.

An embodiment of the present invention will now be explained with reference to FIG. 3B, which is a cross-sectional view illustrating the structure of the circuit of FIG. 3A, according to an embodiment of the invention. Referring to FIG. 3B, the structure of the transistor $T_1$ and the structure of the resistor 12 are the same as those in the device of FIG. 2B. The transistor $T_2$ is provided between the resistor 12, i.e., the $n^+$-type diffusion region 12, and the transistor $T_1$. The source region 30 and the drain region 31 of the transistor $T_2$ are also formed by diffusing $n^+$-type impurity atoms into the semiconductor substrate 4. It will be seen from FIG. 3B that the depth of the source region 30 is greater than the other diffusion region 12, 31, 5 or 6. The source region 30 is formed by diffusing phosphoric atoms. Because the phosphoric atoms can be diffused deeper than the arsenic atoms under the same heat treatment, the depth of the source region 30 can be made greater than the depth of the other diffusion region. In contrast, in the conventional device, because the source region 30', as illustrated by a dotted line in the region 30 of FIG. 3B, was formed by diffusing the arsenic atoms in the same process of diffusing the same atoms to form the other regions, the depth of the source region 30' was as shallow as the other diffusion regions. An insulating film 32 is formed on the p-type semiconductor substrate to cover a part of the source region 30, a channel region 33, and a part of the drain region 31. A gate electrode 25 is formed on the insulating film.

Figure 3C:
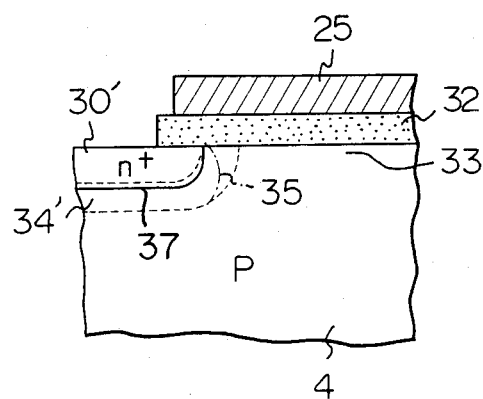
FIGS. 3C and 3D are partially expanded views of FIG. 3B for explaining the conventional structure and the structure of the present invention, respectively.

FIG. 3C is a partially expanded view of FIG. 3B illustrating a part of the conventional transistor $T_2'$. As illustrated in FIG. 3C, the relatively shallow diffusion region, i.e., source region 30' having $n^+$-type conductivity is formed near the surface of the p-type semiconductor substrate. The insulating film 32 covers the part of the source region 30' and the channel region 33. The gate electrode 25 covers the insulating film 32. Because the depth of the source region 30' is substantially independent from the impurity concentration when arsenic atoms are used as the impurities, as will be explained later with reference to FIG. 4, the concentration in the source region 30' is substantially uniform. Therefore, the junction region in the n+-type source region 30' has a relatively high impurity concentration. On the other hand, the p-type semiconductor substrate 4 has a relatively low impurity concentration. Therefore, if the gate electrode 25 does not exist, a depletion layer 34' will be formed in the PN junction 37 between the source region 30' and the semiconductor substrate 4, as illustrated by the dotted line. It will be seen that the depletion layer 34' can not be expanded very much in the source region 30' because of its high impurity concentration. Whereas, because the substrate 4 has a relatively low impurity concentration, the depletion layer 34' is expanded greatly in the substrate 4. The depletion layer 34' could be considered under the assumption that there would be no gate electrode 25. However, the gate electrode 25 really exists. When the device is not being operated, no voltage is applied to the gate electrode 25 so that the potential at the gate electrode 25 becomes substantially equal to the potential of the semiconductor substrate because of leak currents from the gate electrode 25 through internal circuits (not shown) to the semiconductor substrate 4. Accordingly, the gate electrode 25, having substantially the same potential as the substrate, influences the formation of the depletion layer 34' particularly near the surface portion of the substrate 4. As a result, the practical depletion layer 34' is deformed as illustrated by a dash-dot line 35, so that the depletion layer narrows at the surface of the substrate 4. In this state, when an excessive high voltage is applied to the input electrode 10 (FIG. 3B), a breakdown will easily occur at the narrow portion of the depletion layer 34' before the PN junction 17 causes avalanche breakdown or Zener breakdown. Due to the breakdown at the narrow portion of the depletion layer 34', a high voltage from the input electrode 10 through the resistor 12 is applied to the insulating film 32 to burn and destroy it so that an electrical path is produced through the insulating film 32. As a result, the high voltage is applied to the gate electrode 25 through the resistor 12 (FIG. 3B), the line 22 (FIG. 3B), the broken narrow portion of the depletion layer, and the electrical path in the insulating film 32. Thus, the insulating film 32 is destroyed in the conventional device.

Figure 3D:
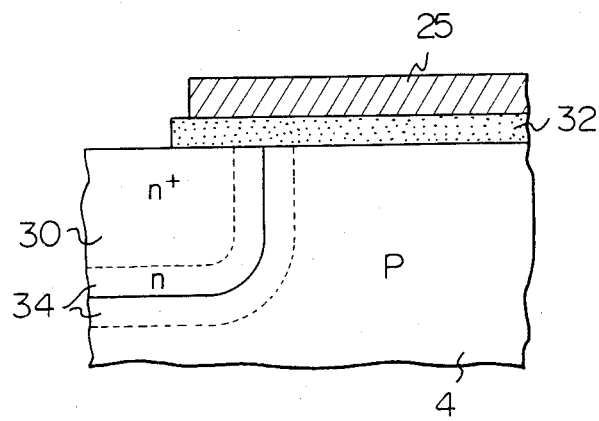

In contrast to the conventional device of FIG. 3C, a part of the transistor T2 according to the present invention is illustrated in FIG. 3D. The only difference between FIG. 3C and FIG. 3D is that, in FIG. 3D, the source region 30 is made deeper than the conventional source region 30'. The deep source region 30 can be formed by using phosphoric ions. When phosphoric atoms are used for impurity diffusion, the concentration of the impurities is dependent on the distance from the surface of the substrate 4, as will be explained later with reference to FIG. 4. That is, the shallow portion of the source region 30 has a higher impurity concentration than the deep portion of the source region 30. Therefore, the impurity concentration in the PN junction portion of the source region 30 is relatively low. As a result, a depletion layer 34 does not narrow as in the conventional device. Accordingly, the tolerance voltage of the depletion layer 34 is higher than that in the conventional device.

Figure 4:
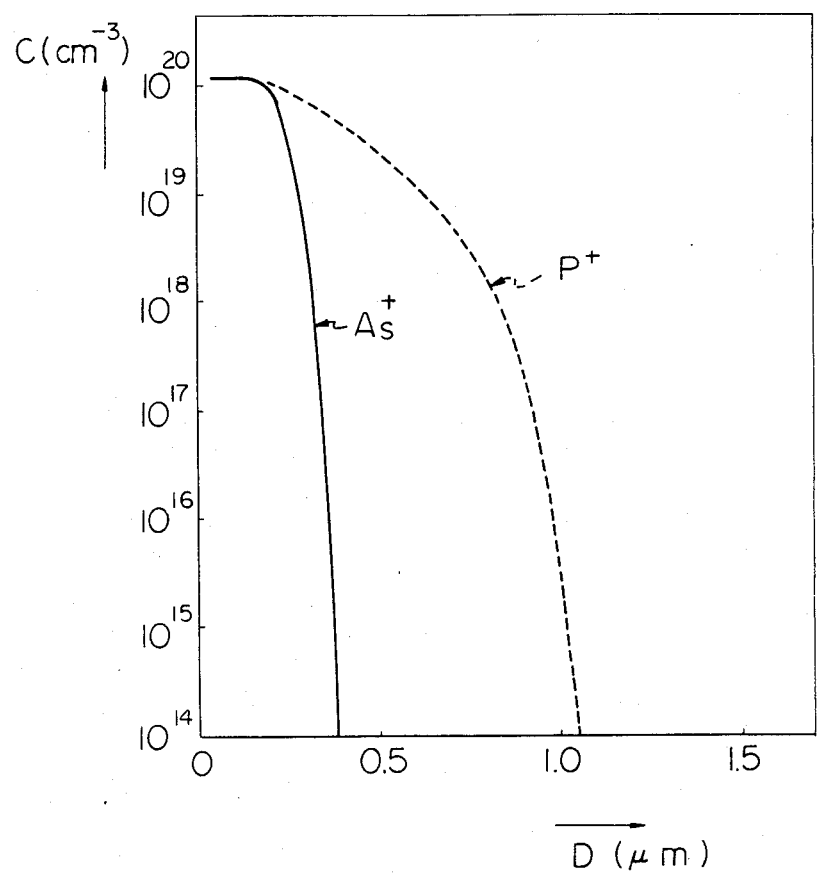
FIG. 4 is a graph illustrating impurity distribution with respect to the distance from surface.

FIG. 4 is a graph illustrating impurity distributions with respect to the distance from the surface of the semiconductor substrate 4. In FIG. 4, the abscissa represents the distance from the surface of the semiconductor substrate 4 expressed in micrometers ($10^{-6}$ m); and the ordinate represents the impurity concentration expressed in cubic centimeters. The solid curve represents the distribution when arsenic ions are used. The dotted curve represent the distribution when additional phosphoric ions are used. These curves can be obtained after heat treatment after implantation of the impurity ions. As will be apparent from FIG. 4, when arsenic ions are used, the maximum depth of diffusion is about 0.4 $\mu$m; and the gradient of concentration along the distance from the surface is small. Whereas, when phosphoric ions are used, the depth of diffusion can be more than 1.0 $\mu$m; and the gradient of concentration along the distance from the surface is large. Therefore, such a broad depletion layer as illustrated in FIG. 3D can be obtained when phosphoric atoms are used for diffusion.

In the manufacturing processes, arsenic ions may first be implanted into the region 12, 31, 5, 6 (FIG. 3B) and the other diffusion regions of the internal circuit (not shown in FIG. 3B), and then phosphoric ions may be implanted into the source region 30. After this, heat treatment is effected to form these diffusion regions. However, the manufacturing processes are not restricted to the above. Phosphoric ions may first be implanted into the source region 30, and then arsenic ions may be implanted to the other regions. Also, arsenic ions may be implanted to all the diffusion regions without masking the source region 30 after or before implanting phosphoric ions into the source region 30. The effect of the broad depletion layer 34 and of the high tolerance voltage is substantially the same by any one of the processes described above.

In order to a much greater increase in the tolerance voltage of the device, the channel length in the channel region 33 (FIG. 3B) may be elongated so that, when a high voltage is applied to the input electrode 10 (FIG. 3B), avalanche breakdown or Zener breakdown will first occur in the PN junction diode 17 before the depletion layer 34, expanded by the high voltage, reaches the depletion layer of the drain region 31. By this elongation of the channel length, the internal transistor $T_1$ is protected from being destroyed.

Also, the gate insulating film 32 of the input stage transistor $T_2$ may be formed thicker than the other miniaturized elements so that the input-stage transistor $T_2$ has a higher tolerance voltage than the other miniaturized elements. This technique of forming a thicker gate insulating layer was suggested in the Japanese Patent Application No. 54-100275, filed on Jan. 24, 1978.

Further, the tolerance voltage of the diffusion region 12 at the portion near the electrode 11 may be made smaller than the tolerance voltage of the region 30 so that a breakdown may first occur at that portion in the diffusion region 12.

From the foregoing description, it will be apparent that, according to the present invention, in a semiconductor integrated device including an input-stage semiconductor element which has an electrode connected to the input electrode of the semiconductor integrated device, merely the electrode connected to the input electrode is made to have a high tolerance voltage, so that all the fine and delicate semiconductor elements integrated in the device are protected from being destroyed by a sudden and abnormally high voltage applied to the input electrode. Accordingly, a semiconductor integrated device having a high reliability and high tolerance voltage against abnormal accidents can be obtained without deteriorating the integration degree and the switching speed.

Although only one embodiment is illustrated in FIG. 3B, various changes and modifications are possible without departing from the basic scope of the present invention.

I claim:

1. A semiconductor integrated device having a high tolerance against abnormally high input voltages, comprising:
    a semiconductor substrate having a first conductivity type;
    an input electrode formed on said semiconductor substrate;
    an input stage of said semiconductor integrated device formed on said semiconductor substrate and including a first MIS transistor comprising a gate insulator layer, a first gate electrode, and a first source region and a first drain region each having a second conductivity type being the opposite of said first conductivity type, said first source region or said first drain region being electrically connected to said input electrode;
    an internal circuit of said semiconductor integrated device formed on said semiconductor substrate and including a second MIS transistor comprising a second gate electrode, a second source region, and a second drain region, each of said second source region and said second drain region having said second conductivity type, said second gate electrode being electrically connected to said first source region or said first drain region not connected to said input electrode; and
    another internal circuit of said semiconductor device operatively connected to said first gate electrode;
    said first source region or said first drain region connected to said input electrode has a depth greater than the depth of said second source or drain region, has a depth greater than said first source region or said first drain region not connected to said input electrode, and has an impurity concentration varying in a first direction perpendicular to the surface of said semiconductor substrate from a first concentration at the surface of said semiconductor substrate to a second concentration lower than said first concentration and at respective levels along said first direction being substantially uniform throughout said first source or drain region in a direction parallel to the surface to the surface of said semiconductor substrate, whereby said first gate insulation layer is prevented from destruction due to said abnormally high input voltages applied to said input electrode.

2. A semiconductor integrated device as set forth in claim 1, further including:
    a resistor comprising a diffusion region having said second conductivity type and arranged between said input electrode and said first source or drain region connected to said input electrode, the tolerance voltage of said first source or said first drain region not connected to said input electrode, and the tolerance voltage between said diffusion region and said semiconductor substrate being made lower than the tolerance voltage of said first source or drain region connected to said input electrode.

3. A semiconductor integrated device as set forth in claim 1, wherein, said first source or first drain region connected to said input electrode is doped with phosphoric atoms, whereas, said second source region, second drain region, and said first source region or said first drain region not connected to said input electrode is doped with arsenic ions.

4. A semiconductor integrated device as set forth in claim 2, wherein said diffusion region is doped with arsenic ions.

5. A semiconductor integrated device as set forth in claim 4, wherein said input electrode comprises a first electrical contact to an end of said diffusion region, and said first source or first drain region is operatively connected to the other end of said diffusion region.

6. A semiconductor integrated device as set forth in claim 2, wherein, said first source or drain region connected to said input electrode is doped with phosphoric atoms, whereas, said second source region and said second drain region, and said first source region or said first drain region not connected to said input electrode is doped with arsenic atoms.

7. A semiconductor integrated device as set forth in claims 1, 2, 3, 4, 5 or 6, wherein, the depth of said first source or drain region connected to said input electrode is more than one micrometer, and the maximum depth of said second source region and said second drain region is 0.5 micrometers.

* * * * *

UNITED STATES PATENT AND TRADEMARK OFFICE
CERTIFICATE OF CORRECTION

PATENT NO. : 4,503,448
DATED : March 5, 1985
INVENTOR(S) : Miyasaka

It is certified that error appears in the above-identified patent and that said Letters Patent is hereby corrected as shown below:

Column 4, line 26, "30 " should be --30'--.

Signed and Sealed this

Thirtieth Day of July 1985

[SEAL]

Attest:

DONALD J. QUIGG

Attesting Officer     Acting Commissioner of Patents and Trademarks